United States Patent [19]

Jericho

[11] 4,367,199

[45] Jan. 4, 1983

[54] APPARATUS HAVING COILABLE PULLING ELEMENT FOR DRAWING A MONOCRYSTAL FROM A CRUCIBLE WITH ADJUSTABLE SPEED

[75] Inventor: Karl Jericho, Hanau, Fed. Rep. of Germany

[73] Assignee: Leybold Heraeus GmbH, Cologne, Fed. Rep. of Germany

[21] Appl. No.: 272,802

[22] Filed: Jun. 11, 1981

[30] Foreign Application Priority Data

Jun. 14, 1980 [DE] Fed. Rep. of Germany ....... 3022412

[51] Int. Cl.³ ............................................. C30B 15/20
[52] U.S. Cl. ..................................... 422/110; 422/249
[58] Field of Search ....................... 422/108, 110, 249; 156/DIG. 93, DIG. 98, 617 SP; 192/0.096, 0.098, 0.033, 103 R, 84 A, 84 B, 84 C

[56] References Cited

U.S. PATENT DOCUMENTS 3,511,609  5/1970  Kato ..................................... 422/249
3,865,554  2/1975  Wenckus ............................. 422/249

Primary Examiner—Hiram Bernstein
Attorney, Agent, or Firm—Felfe & Lynch

[57] ABSTRACT

The invention relates to an apparatus for drawing a monocrystal from a crucible by means of a coilable pulling element having the end that is located above the crucible secured a crystal-nucleus holder. The pulling element, which is preferably a steel cable, is connected to a lifting drive which is arranged on a platform which is rotatable about the pulling element. The lifting drive comprises a driven horizontal shaft with a longitudinally displaceable coiling drum thereon, onto which drum the pulling element can be tangentially coiled. The vertical speeds of the crystal-nucleus holder can be adjusted to speeds which differ greatly from each other by providing the lifting drive with a drive motor for rapid operation and a drive motor for flow operation, which motors act on the coiling drum by way of shafts which can be disconnected from each other by means of a clutch but which are disposed coaxially. In this arrangement, the drive motor for rapid operation is connected to the non-disengageable shaft and the drive motor for slow operation is connected to the disengageable shaft.

7 Claims, 3 Drawing Figures

APPARATUS HAVING COILABLE PULLING ELEMENT FOR DRAWING A MONOCRYSTAL FROM A CRUCIBLE WITH ADJUSTABLE SPEED

BACKGROUND OF THE INVENTION

The invention relates to apparatus for drawing a monocrystal from a crucible by means of a coilable pulling element, and in particular by means of a cable. The end of the cable which is arranged above the crucible is secured to a crystal nucleus holder which is connected to a lifting drive means which is arranged on a platform rotatable about the pulling element and comprises a driven horizontal shaft having a coiling drum which is longitudinally displaceable on this shaft and onto which the pulling element can be tangentially coiled.

Since it has already been used in public, apparatus of the above-described kind forms part of the prior art. However, the known apparatus has only one drive motor for the lifting drive means, so that the setting of greatly differing vertical speeds of the crystal-nucleus holder is possible only by way of the motor speed. The precision in the control of such motors, which are exclusively controllable direct-current motors, is, for example, 2.0% of 3000 revolutions per minute in terms of the final speed. The resultant deviations of ±6 r.p.m. are still obtained, however, even at low speeds, so that in the case of a control range of 1:1000 down to 3 r.p.m., the relative error would increase to 200%. This error is extremely undesirable in the crystal-drawing process which is carried out only at low speeds of revolution. For this purpose, the known drive has been so designed that the change in speed is only 1:100. The maximum lifting speed is thus limited to approximately 20 cm/min, for example, a value that is too low for a high-speed movement.

For the purpose of setting stepped speeds, it would be theoretically feasible to use motors change-over gears. However, these possible means are precluded, since the gears that might be considered for the purpose tend to vibrate. However, vibrations in the drive system have an effect which could be harmful in the production of monocrystals, since such production is possible only if the drawing process is free from trouble. Furthermore, in the known apparatus, the vertical speed of the crystal-nucleus holder must be variable over a wide range for control purposes and/or for adapting the apparatus to suit various types of crystal, and this of necessity is manifested by a change in speed of the lifting drive motor. Motors with commutatable poles cannot as a rule be used for such a purpose, since they have rigid speed graduation.

SUMMARY OF THE INVENTION

The object of the invention is, therefore, to provide apparatus of the initially described kind whereby specific but greatly differing vertical speeds of the crystal-nucleus holder can be achieved and whereby adjustability within wide limits is also possible within the various ranges of vertical speeds.

According to the invention, the object is achieved in that the lifting drive means comprises a drive motor for rapid operation and a drive motor for slow operation, which motors act on the coiling drum through shafts which are separable from each other by means of a clutch but are coaxial, and in that the drive motor for rapid operation is connected to the non-disengageable shaft and the drive motor for slow operation is connected to the disengageable shaft.

Associated with this arrangement is the fact that operating speeds that differ greatly from each other can be achieved at the two mutually separable shafts. The speed graduation of the two shafts may be, for example and for preference, 1:30. Since, given the present state of the art, there is no difficulty at all in, for example, designing the drive motors in such a way that they are able to operate free from vibration over a control range of, for instance and for preference, 1:40, the vertical speed of the crystal-nucleus holder can be varied in the ratio 1:1200.

It is possible, for example to equip the drive motor for slow operation with a gear which provides a great reduction and which can operate in the self-locking range. If the low-speed rotor is not required, it is simply disengaged, so that locking of the high-speed rotor is precluded. On the other hand, the high-speed rotor is permanently in engagement with the coiling drum by way of the shaft associated with the rotor, so that it can be advantageously equipped with an incremental signal transmitter for signalling the position of the pulling element.

The high-speed rotor is preferably used when the crystal-nucleus holder has to be brought into its initial position at the commencement of a fresh drawing process. In this system and depending upon the maximum length of crystal for which the apparatus is designed, a distance of several meters has to be travelled. Since the crystal-drawing operation itself proceeds extremely slowly and extends over many hours, the crystal-nucleus holder having the known signal-motor drive can be brought into the initial position for a further drawing operation only after a period of many minutes, even when the motor is set to maximum speed. Using the subject matter of the invention, it is possible to reduce this lost time to a fraction, so that the apparatus is rendered considerably more economical. Furthermore, it is possible, by means of the high speed rotor or rapid drive, to eliminate any difficulties that may occur in the drawing process by briefly switching the high-speed rotor, so that wastage of material is reduced.

Advantageously, the apparatus of the invention can be so designed that a contact column having contact rings and sliding contacts for the supply of electric power to the lifting drive means and for the transmission of switching and control signals is arranged on the rotatable platform and coaxially with its axis of rotation. Thus, the drive motors are able to rotate with the platform, so that complicated mechanical transmission systems can be dispensed with. The switching and control signals include, for example, such signals which indicate the two end positions of the coiling drum, as well as incremental signals whereby the particular position of the pulling element can be determined. For the purpose of producing the switching signals, the coiling drum is preferably provided with at least two signal transmitters which co-operate with correspondingly set signal receivers in such a way that switching signals can be produced when the coiling drum is in its end positions. Further advantageous features of the subject matter of the invention are described hereinafter.

An example of the construction of the subject matter of the invention will now be described in greater detail by reference to the drawings, wherein:

DETAILED DESCRIPTION OF THE INVENTION

Figure 1:
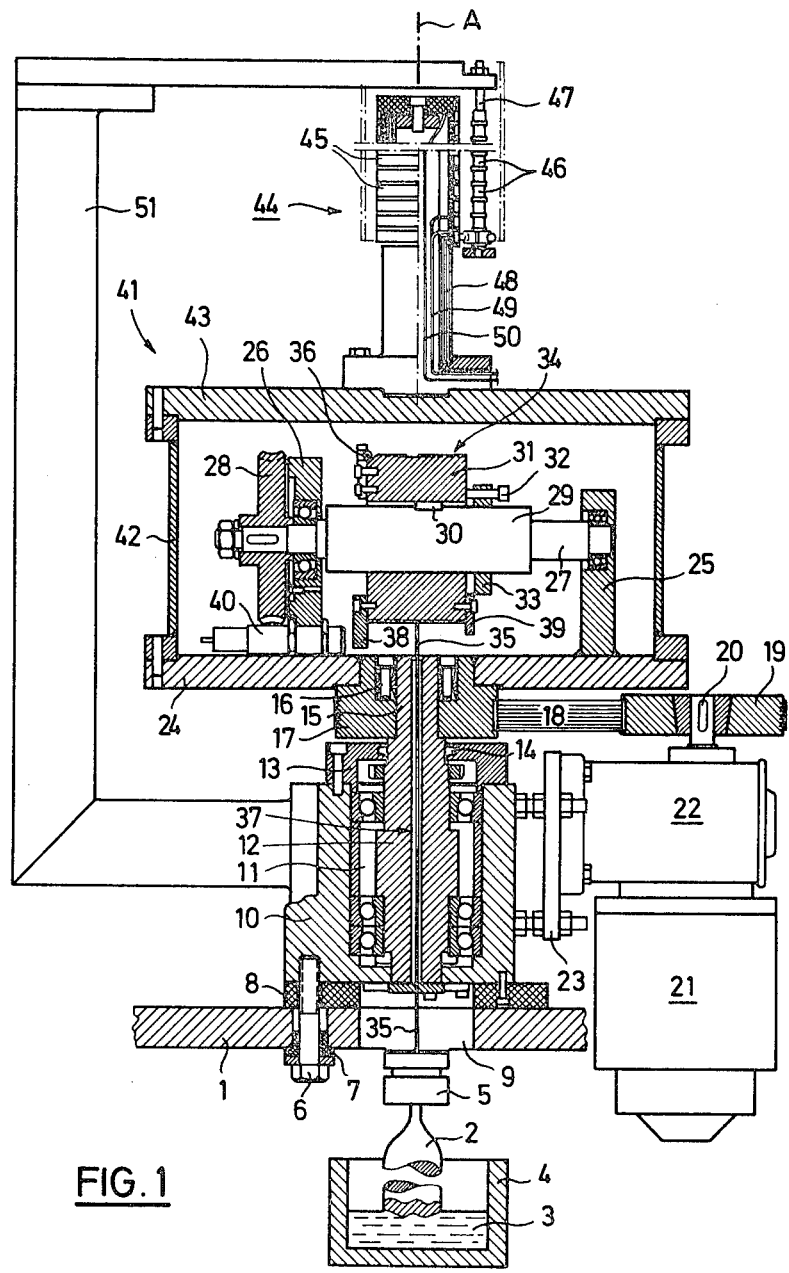
FIG. 1 illustrates a partial vertical section, along the line I—I of FIG. 3, through the drive part of a crystal-drawing apparatus.

FIG. 1 illustrates the upper part 1 of a closed chamber in which a monocrystal 2 can be produced in a vacuum or in an atmosphere that determines the condition of the crystal. This is achieved by the known crucible-drawing method, in which a melt 3, from which the monocrystal 2 is subsequently formed, is located in a crucible 4. Above and coaxial with the crucible is a crystal-nucleus holder 5. The above-described parts and the parameters of the method required for operating them form part of the prior art, so they do not require to be dealt with in further detail.

A bearing housing 10 of substantially box-like external shape is secured to the upper part 1 by means of screw-bolts 6 and insulating intermediate layers 7 and 8, the housing being located at the periphery of an opening 9. Within the bearing housing is a bore 11 having ball bearings, not shown in detail, in which is mounted a tube 12 which also forms the central shaft of the rotary drive described below. At the top, the bearing housing 10 is closed off by a cover 13, which is sealed off in a dust-tight manner from the tube 12 (shaft) by means of a sealing element 14. For the sake of simplicity, that part of the tube 12 that is located outside the bearing housing 10 is referred to as a shaft 15. A vacuum seal is provided at the lower end of the tube 12.

By means of a clamping screw 16, a pulley 17 is mounted on the shaft 15 to rotate therewith, which pulley is connected, by way of a V-belt 18, to a further pulley 19 which is secured to the output shaft 20 of a geared motor unit, which consists of a rotary motor 21 and a reduction gear 22. By means of a flange plate 23 and several set-screws, not illustrated in detail, the reduction gear 22 is secured to the bearing housing 10 on which it can be horizontally displaced so that the V-belt 18 can be tensioned.

Secured to, and rotatable with, a reduced part of the pulley 17 is horizontal platform 24 which, together with the tube 12 or the shaft 15, can be caused to rotate by the motor 21. Secured to the platform 24 are two bearing blocks 25 and 26 in which a horizontal shaft 27 is mounted by means of ball-bearings, not illustrated in detail. This shaft carries a worm wheel 28 at one of its ends, and, between the bearing blocks, it carries a sliding sleeve 29 which does not rotate relatively to the shaft but is displaceable in the longitudinal direction; a coiling drum 31 is arranged on the sliding sleeve in such manner that it does not rotate relatively thereto but is displaceable in the axial direction, and an adjusting spring 30 is interposed between the sliding sleeve and the winding drum. The winding drum 30 is displaced relatively to the sliding sleeve 29 by means of an adjusting screw 32 which is mounted in a ring 33, which is firmly connected to the sliding sleeve 29.

The coiling drum has, in its outer surface, a spiral groove 34, in which is laid a coilable pulling element 35 in the form of a cable. One of the ends of this pulling element is firmly connected to the coiling drum 31 by way of a clamping segment 36, whereas the other end of the pulling element passes out of the groove 34 in the tangential direction and concentrically through the bore 37 of the tube 12 and vertically downwards, to be connected to the crystal-nucleus holder 5. The pulling element 35 lifts off the coiling drum 31, i.e. out of the groove 34, at a point exactly above the longitudinal axis of the bore 37. In this way the pulling element 35 is caused to rotate previsely coaxially in the bore 37 when the platform 24 rotates, so that the crystal-nucleus holder 5 and therefore the monocrystal 2 also rotate concentrically in relation to the crucible 4. The coiling drum 31 itself rotates eccentrically about a vertical axis which coincides with the axis of the pulling element 35. This axis extends substantially tangentially of the outer surface of the coiling drum i.e., tangentially of the center-point of the groove 34.

Figure 2:
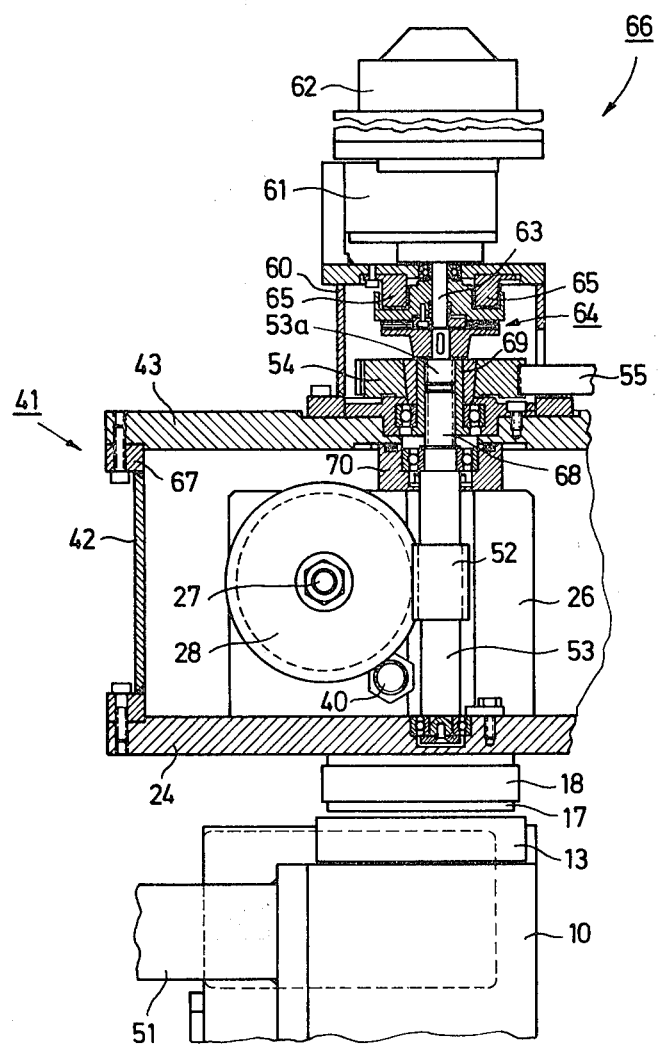
FIG. 2 shows a partial vertical section, along the line II—II of FIG. 3, through the apparatus of FIG. 1.

Secured to the coiling drum 31 are two ferromagnetic signal transmitters 38 and 39, each of which co-operate with an inductive signal receiver 40. In FIGS. 1 and 2, only the signal receiver that co-operates with the signal transmitter 38 is shown. In this way, the axial displacement of the coiling drum caused by the pulling element 35 during its longitudinal movement is picked up by the signal receivers, so that switching signals can be produced when the coiling drum is in its end positions. In order to obtain readily detectable switching signals, the signal transmitters are expediently designed as sectors, i.e. are limited to part of the circumference of the coiling drum.

The above-mentioned components above the platform 24 are surrounded by a hood 41 which consists of a cylindrical envelope 42 and of a cover 43 which seals off the envelope. Arranged on the cover 43 and coaxially with the axis of rotation A of the entire system is a contact column 44, which consists of a plurality of contact rings 45 and associated sliding contacts 46 of fixed location which are arranged on a contact holder 47. The contact rings 45 are secured concentrically on a carrier tube 48 of insulating material. Leads 49 and 50 run from the individual contact rings to the lifting drive motor described below. Some of the leads are connected to the signal transmitters and to incremental transmitters etc. The contact holder 47 is secured to a support 51, which extends around the platform 24 carrying the hood 41, and which is screwed to the bearing housing 10 at its lower end.

Figure 3:
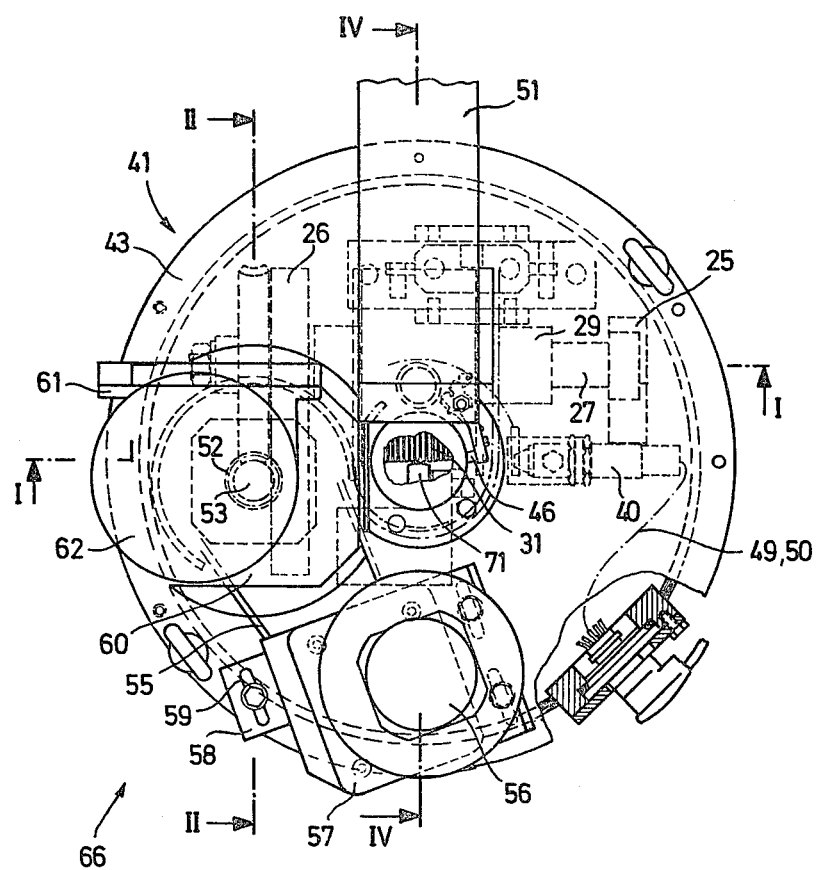
FIG. 3 is a plan view of the apparatus of FIG. 1.

In FIG. 2, parts previously described carry the same reference numerals as the parts therein and the following is also illustrated. A worm 52, which is secured to a shaft 53, engages with the worm wheel 28. The shaft 53 is mounted at one end in the platform 24 and at the other in the cover 43 by means of ball-bearings, not shown in detail. Fitted at the upper end of the shaft 53, so as to rotate therewith, is a pulley 54, which is connected to a drive motor 56 for rapid operation by way of a V-belt 55 (FIG. 3). The drive motor 56 is provided with a reduction gear 57 and is swingably mounted on a flange plate 58 which enables the V-belt 55 to be tensioned with the aid of a slot 59. Under the action of the drive motor for slow operation, described in detail hereinafter, the drive motor 56 can be freely rotated, and it is provided with an incremental signal transmitter, not illustrated, for detecting the particular position of the pulling element.

FIG. 2 also shows that an intermediate housing 60, which surrounds the pulley 54, is secured to the cover 43. A drive motor 62 for slow operation is secured to the intermediate housing 60, a reduction gear 61 being provided between said motor and said intermediate housing. The reduction gear 61 has a vertical shaft 63, which extends coaxially with the shaft 53 but can be disengaged therefrom. A magnetic clutch 64 with solenoids 65 is provided between the shafts 53 and 63 and within the intermediate housing 60. By means of this clutch 64, the drive motor 62, which is self-locking on account of the reduction gear 61, can be disconnected from the shaft 53. As soon as the drive motor 62 and the clutch 64 are switched in and the drive motor 56 (FIG. 3) is cut out, the shafts 53 and 63 are connected to each other and also cause the drive motor 56 to turn, which step is important because of the presence of the incremental signal transmitter. If, however, the drive motor 62 and the clutch 64 are cut out, the shaft 63 and the associated clutch part remain stationary, whereas only the pulley 54 is rotated at a correspondingly higher speed while causing the shaft 53 also to turn. The drive motors 56 and 62 together with the line-up gears, etc., form what is called the lifting drive unit 66.

As can be seen from FIG. 2, the hood 41 is very easy to open, rapid-action screw-connections, now shown in any great detail, being provided between an upper flange 67 of the envelope 42 and the edge of the cover 43. The enable the cover 43 and the components mounted thereon to be lifted, the upper end of the shaft 53 has a splined profile 68, which engages in a complementary internal serration in a rotatably mounted sleeve 69. A shaft-stub 53a, which forms an extension of the shaft 53 and forms a single unit therewith in the arrangement illustrated in FIG. 2, engages in this sleeve. Secured to the shaft-stub 53a is one part of the clutch 64. If the cover 43 is opened, the sleeve 69, and with it the shaft-stub 53a as well as the pulley 54 and the upper ball bearing unit, surrounding the splined profile 68 and mounted in the cover 43, are removed from the splined profile 68. Then, the shaft 53 is held at its upper end only by the lower ball-bearing unit, which is clamped upwardly against the cover 43 by means of a bearing housing 70. This easy of removal of the cover 43 together with all of the assembly mounted thereon, represents a very special advantage as regards monitoring and inspection of the apparatus.

The following can also be seen from FIG. 3. The coilable pulling element (cable) is guided in a groove formed in the coiling drum 31 and passes tangentially into this groove. Arranged at the point of the tangential contact between the pulling element and the coiling drum 31, i.e. at the level of the axis of the shaft 27, is a pressure-applying roller 71, the surface of which is slightly barrelled.

The expressions "rapid operation" and "slow operation" relate to the here determinative rotary or peripheral speed of the coiling drum, or to the vertical speed of the crystal-nucleus holder. Thus, the terms do not necessarily relate to the speed of revolution of the rotors of the motors.

What is claimed is:

1. In an apparatus for drawing a monocrystal from a crucible by a coilable pulling element having one end disposed above the crucible and secured to a crystal nucleus holder and the other end connected to lifting drive means disposed on a platform rotatable about the pulling element and bearing lifting means including a driven horizontal shaft wheel and being driven by a worm and having a coiling drum which is longitudinally displaceable on the shaft and onto which the pulling element is tangentially coiled, the improvement wherein the lifting drive means comprises two drive motors, the first drive motor for relatively rapid operation with respect to the second and the second drive motor for relatively slow operation with respect to the first, and means for selectively connecting the second motor to the said worm comprising a first shaft connected to the worm and the first motor, a second shaft coaxial with the first shaft and connected to the second motor and clutch means for connecting the first and second shafts for slow operation and alternately disengaging the two shafts for fast operation.

2. The apparatus according to claim 1, wherein the first drive motor includes an incremental signal transmitter for signalling the position of the pulling element.

3. The apparatus according to claim 1, wherein the shaft for the coiling drum has a worm wheel and the first shaft a worm disposed vertically for engagement with the worm wheel.

4. The apparatus according to claim 1, wherein the rotatable platform includes a hood which encloses the coiling drum and wherein the lifting drive means is disposed on the hood.

5. The apparatus according to claim 1, further comprising a tube which is concentrically rotatable about the axis of the pulling element and which is secured to and rotates with the platform.

6. The apparatus according to claim 4, further comprising means for providing power to the lifting drive means comprising a substantially cylindrical contact column with parallel, coaxial contact rings and sliding contacts all disposed on the hood coaxially with the axis of rotation.

7. The apparatus according to claim 1, further comprising at least two signal transmitters secured to the coiling drum and at least two signal receivers disposed on the platform for cooperating with the signal transmitters to produce switching signals when the coiling drum is in its end positions.

* * * * *

UNITED STATES PATENT AND TRADEMARK OFFICE
CERTIFICATE OF CORRECTION

PATENT NO. : 4,367,199
DATED : January 4, 1983
INVENTOR(S) : Karl Jericho

It is certified that error appears in the above-identified patent and that said Letters Patent is hereby corrected as shown below:

Column 6, line 12      After "shaft", insert -- bearing a worm --.

Signed and Sealed this

*Twenty-first* Day of *February 1984*

[SEAL]

*Attest:*

GERALD J. MOSSINGHOFF

*Attesting Officer*    *Commissioner of Patents and Trademarks*